United States Patent [19]

Lee et al.

[11] Patent Number: 5,427,971

[45] Date of Patent: Jun. 27, 1995

[54] METHOD FOR FABRICATION OF SEMICONDUCTOR ELEMENTS

[75] Inventors: Chang J. Lee; Gong H. Park, both of Chungcheongbuk-do, Rep. of Korea

[73] Assignee: Goldstar Electron Co., Ltd., Chungcheongbuk-do, Rep. of Korea

[21] Appl. No.: 203,896

[22] Filed: Mar. 1, 1994

[30] Foreign Application Priority Data

Feb. 1, 1994 [KR] Rep. of Korea ............... 1812/1994

[51] Int. Cl.⁶ .................................. H01L 21/8234
[52] U.S. Cl. ................................. 437/44; 437/41; 437/69; 437/72; 437/913; 148/DIG. 117
[58] Field of Search ............... 437/44, 69, 56, 57, 437/72, 41, 913; 148/DIG. 53, DIG. 117

[56] References Cited

U.S. PATENT DOCUMENTS

| | | | |
|---|---|---|---|
| 5,071,777 | 12/1991 | Gahle | 437/57 |
| 5,100,815 | 3/1992 | Tsubone et al. | 437/56 |
| 5,100,820 | 3/1992 | Tsubone | 437/44 |

FOREIGN PATENT DOCUMENTS

| | | | |
|---|---|---|---|
| 2262321 | 10/1990 | Japan | 437/69 |
| 0448640 | 2/1992 | Japan | 437/69 |
| 5152427 | 6/1993 | Japan | 437/69 |

Primary Examiner—Brian E. Hearn
Assistant Examiner—Michael Trinh
Attorney, Agent, or Firm—Poms, Smith, Lande & Rose

[57] ABSTRACT

This invention relates to a method for fabrication of MOS transistors having LDD(Lightly Doped Drain) structure which comprises the steps of forming a gate insulation film on a semiconductor substrate of a first conduction type, forming a conduction layer for forming a gate pole on the gate insulation film, forming an oxidation prevention layer on the conduction layer, carrying out selective etchings of the oxidation prevention layer and the conduction layer to a certain thicknesses of areas except the gate pole area, forming an oxide film by an oxidation of the exposed portion of the conduction layer, carrying out a selective etching of the oxide film by using the oxidation prevention layer as a mask, forming a high density impurity area of a second conduction type in a predetermined area of the semiconductor substrate by a high density ion injection of the second conduction type impurity, removing the oxidation prevention layer and the oxide film, forming a low density impurity area of the second conduction type in a predetermined area of the semiconductor substrate by a low density ion injection of impurity of the second conduction type using the conduction layer as a mask, and carrying out an annealing under an oxidation process atmosphere.

21 Claims, 7 Drawing Sheets

METHOD FOR FABRICATION OF SEMICONDUCTOR ELEMENTS

FIELD OF THE INVENTION

This invention relates to a method for fabrication of semiconductor elements, more particularly to a method for fabrication of MOS transistors having LDD(Lightly Doped Drain) structure.

BACKGROUND OF THE INVENTION

In fabrication of semiconductor integrated circuits, efforts to decrease the size of MOSFET(Metal-Oxide-Semiconductor Field Effect Transistor) consisting semiconductor integrated circuits have been continued to obtain highly integrated semiconductor elements having excellent performance.

As a result of such efforts, the art for fabrication of semiconductor integrated circuits has scaled down to reach to sub-micron level.

Scale down of a semiconductor element has to be carried out in horizontal direction as well as in vertical direction proportional to the horizontal direction to balance with various characteristics of other elements.

That is, when an element is to be scaled down, for example distance between a source and a drain is to come closer, not wanted characteristic changes of an element is to cause, of which the short channel effect is typical.

To solve the short channel effect, a horizontal dimension(length of a gate) as well as a vertical dimension(-thickness of a gate insulation film, joining depth etc.,) have to be decreased, and accordingly the applied voltage has to be lowered, the doping concentration of the substrate has to be thickened, and especially, the doping profile of channel area has to be adjusted.

However, despite an element in an electronic product has to meet the required applied voltage of the product, because the applied voltage required for electronic products using semiconductor elements has not been decreased though the dimension of semiconductors has been decreasing, in case of semiconductor elements, particularly NMOS transistors have become to have a weak structure against hot carrier developed by accelerated electrons applied to a source accelerated by an abrupt high electric field near a drain due to a short channel effect developed by the decreased distance between the source and the drain.

According to a reference paper [Chenming Hu et al., "Hot Electron-Induced MOFET Degradation Model, Monitor and Improvement," IEEE Transactions on Electron Devices, Vol. ED-32, No.2, 1985, pp.375 to 385], the instability by hot carrier is due to by a very high electric field caused by a short channel length and an high applied voltage near a drain junction. Consequently, a LDD structure having improved the structure of existing NMOS which is weak against hot carrier with a short channel length was proposed.

The feature of a LDD structure disclosed in a paper [K. Saito et al., "A New Short Channel MOSFET with Lightly Doped Drain," Denshi Tsushin Rengo Taikai 1978, pp 220] is one that solved the instability of elements due to hot carrier by designing a N−area(low density impurity area) formed to have a narrow width and self-aligned to spread-out the high electric field near the drain junction so that carriers(electrons)applied from the source are not to be accelerated even in a high electric field.

In developing a technology for fabrication of elements having an integration over 1M DRAM, many a technology for fabrication of MOSFETs having LDD structure are proposed, in which a LDD forming method using a gate side wall spacer is typical, that has been being used in most mass-production technology until now.

The LDD forming method using a gate side wall spacer is to be explained hereinafter, referring to FIGS. 1.

Figure 1A:
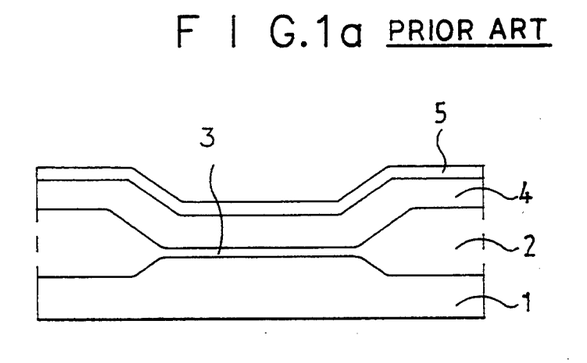

First, as shown in FIG. 1(a), a gate oxide film 3, a conduction layer 4 for forming gate poles and a gate cap oxide film 5 are formed successively on a P type semiconductor substrate 5 an active area on which a transistor will be formed with a field oxide film 2 has been defined thereon.

Figure 1B:
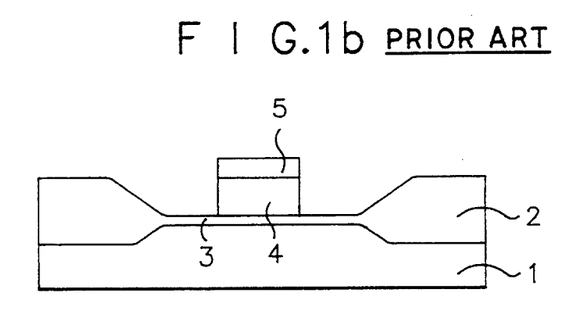

Then, as shown in FIG. 1(b), a gate pole is formed by carrying out a patterning of the cap oxide film 5 and the conduction layer 4 using a gate pole pattern.

Figure 1C:
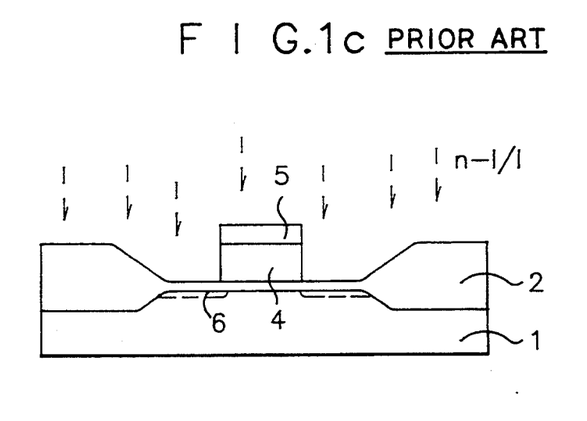

Next, as shown in FIG. 1(c), a N−area 6 is formed for the gate pole 4 in a self-aligning way on the substrate by ion injecting phosphor(p) in low density as a N type impurity.

Figure 1D:
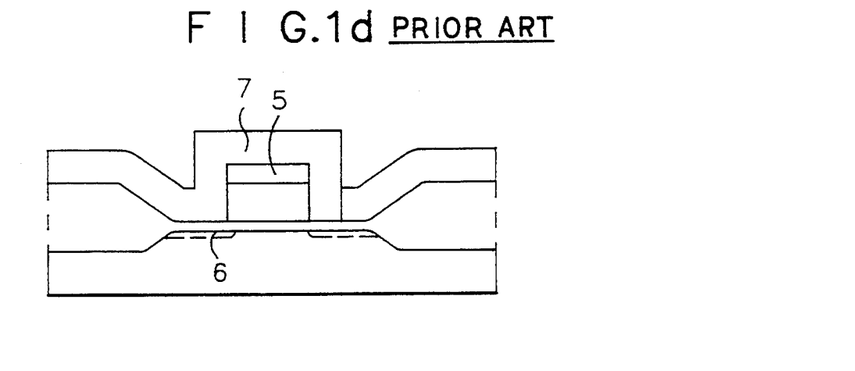
Figure 1E:
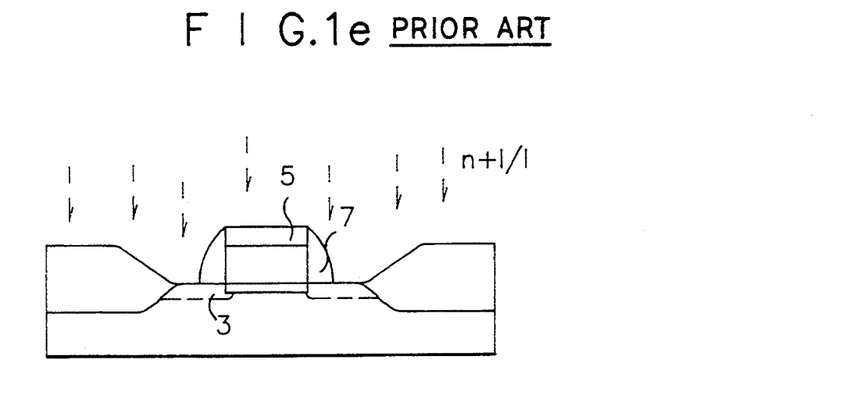

Then, as shown in FIG. 1(d), an oxide film 7 is formed over the substrate with CVD(Chemical Vapor Deposition) method, and, as shown in FIG. 1(e), the CVD oxide film 7 is etched back with RIE(Reactive Ion Etching) technique to form gate side wall spacers.

Figure 1F:
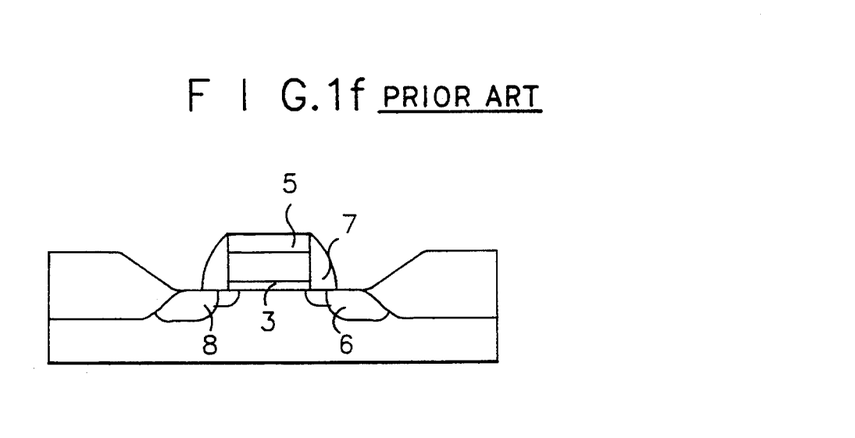

Next, as shown in FIG. 1(f), a N+source and a drain area 8 are formed having a deeper junction depth by a high density ion injection of N type impurity. In this time, because the gate side wall spacer serves as a mask in the high density ion injection process for forming the N+source and the drain areas, it is possible to form a N−area 6 between the gate channel and the N+source and the drain areas.

However, a method for fabrication of transistors having a LDD structure utilizing the gate side wall spacer described above has a few problems, particularly above method is not appropriate for an practicable technology for fabrication of next generation semiconductor elements requiring high integration and high quality.

That is, because the additional process of the gate side wall spacer forming process features that carrying out etch back after deposition of a CVD Oxide film, the silicon substrate of the active area become exposed in the etch back process, the active area exposed thus, is overetched (ie., damage to the silicon substrate), of which overetched depth shows a serious non-uniformity of different aspect between them depending on the position of silicon substrate and the density of patterns, therefore non-uniform electric characteristic of an element is exhibited depending on the position of a chip.

Further, the plasma radical species of CF4, CHF3 and O2 etc., used in the etch back process for side wall spacer forming infiltrate into the silicon substrate, though it depends on RF power in the etching process, forming chemical compound layers of CFx-Polymer, Si—C bond, Si—O bond, Si—O—C bond etc., within a range of 500 Angstroms from the surface of the silicon substrate.

Figure 2:
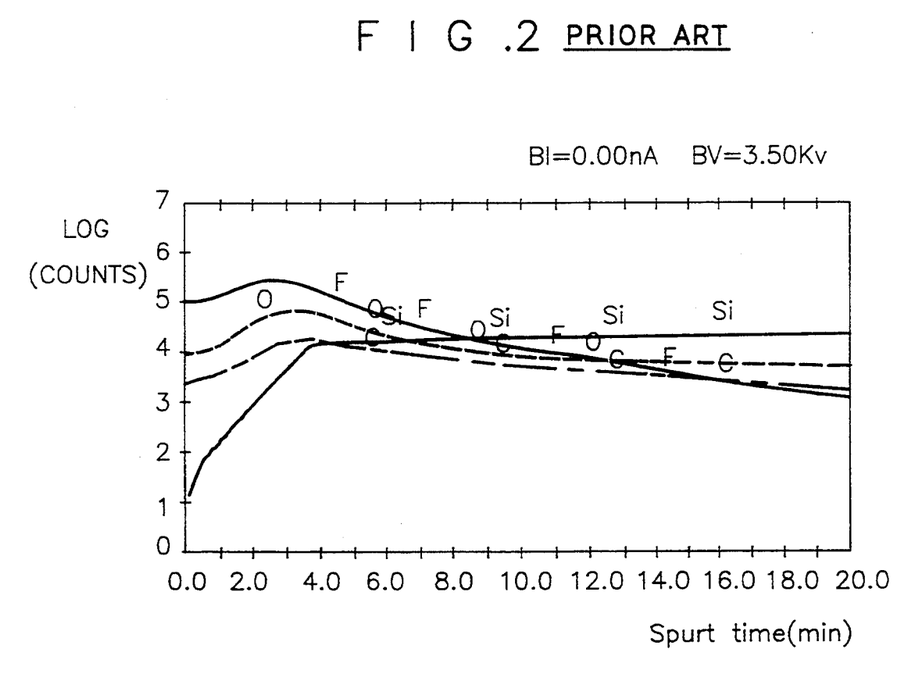

FIG. 2 shows a SIMS(secondary ion mass spectroscopy) analyzed profile of a silicon substrate after etching of an oxide film, wherein the CFx-polymer, Si—C bond, Si—O bond and Si—O—C bond can be seen.

Therefore, in high integration elements requiring shallow junction, because the bonding sites of the chemical compounds described above exist within a depletion region under the voltage applied to junctions serving as trap centers developing carriers resulting to cause the leakage current of the junction to increase. This is explained in detail in the paper of [Jae Jeong Kim et al.," Cleaning process for removing oxide etch residue," Proceeding of contamination control and defect reduction in semiconductor manufacturing I, pp. 408 to 415, 1992, Toronto]"

Figure 3:
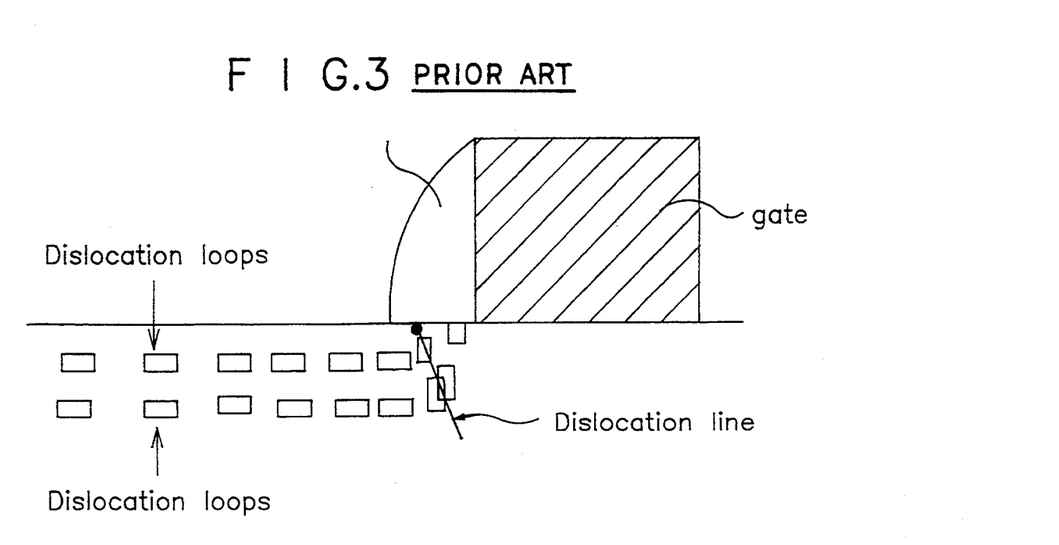

Another problem in LDD structure forming method using gate side wall spacer is that, because the gate side wall spacer is generally formed almost vertical to the silicon substrate, making stress to concentrate on the edge area where the gate space meets with the substrate, dislocation lines are formed from the edge of the side wall spacer to the direction of bulk of the substrate as shown in FIG. 3 depending on the shape of the gate side wall spacer.

Figure 4A:
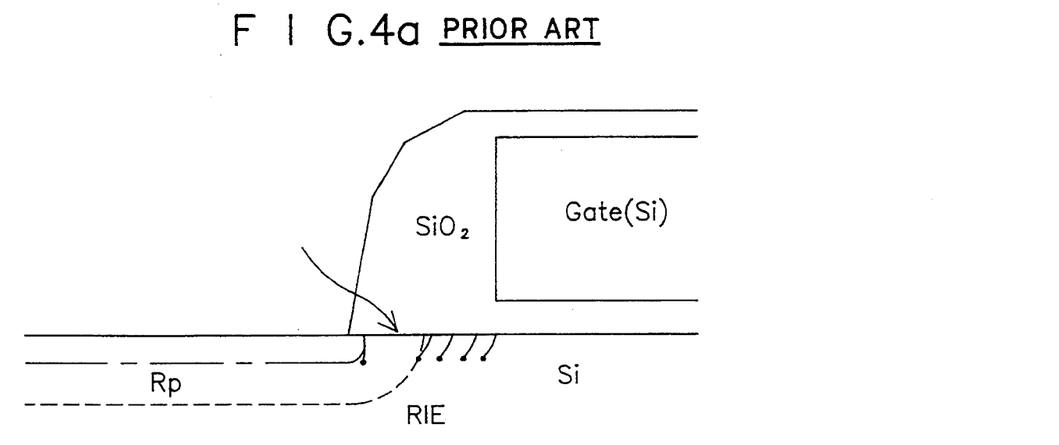
Figure 4B:
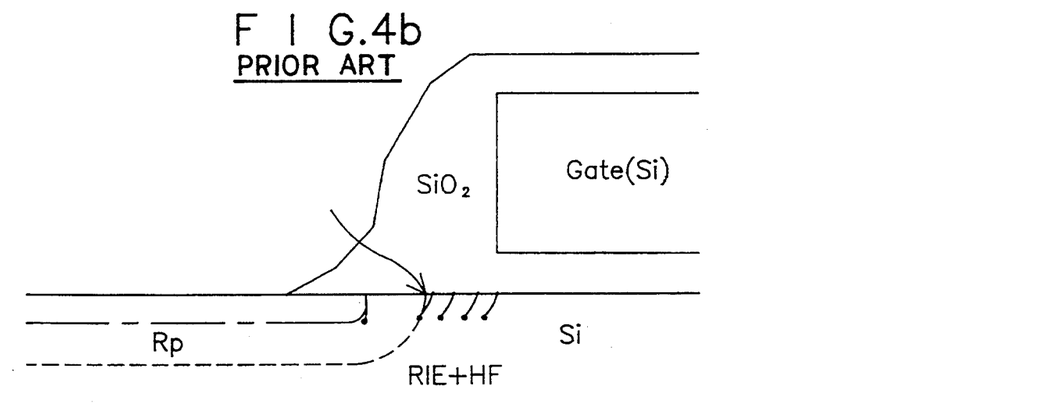
Figure 5:
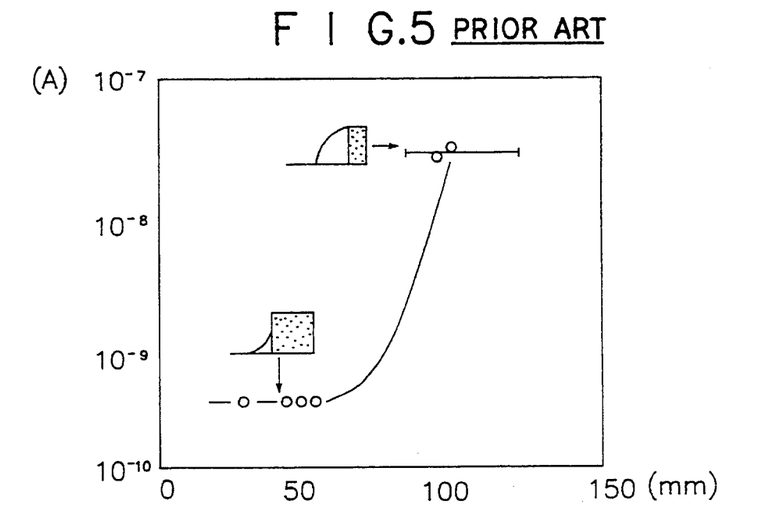

That is, as shown in FIG. 4, depending on the angle to the silicon substrate, the stress on the silicon substrate is of the ranges of 2.7 ╫10 dyn/cm(FIG. 4(b) to 5.4 ╫10 dyn/cm(FIG. 4(a)), which stress concentrate on the edge region where the side wall spacer and the silicon substrate meet, and the more steeper the slope of the gate side wall spacer, the easier the development of the dislocation. As shown in FIG. 5, an increase of the dislocation causes an increase of the junction leakage current of an element. and consequently causes element fail. This is described in detail in the paper of [Shigeo Onishi et al., "Formation of a Defect Free Junction later by controlling defects due to As+ Implantation," IEEE/IRPS, 1991, pp. 255 to 259].

Following the decrease of element size, the tolerance of fabrication process has been decreased, which makes the deterioration of element characteristic (particularly, increase of junction leakage current) caused by the overetch of the silicon substrate developed in the processes of CVD oxide film deposition and etching, which is the core process of the gate side wall spacer forming method, the plasma radical species infiltration, and the dislocation due to the side wall spacer profile, become a great problem.

Accordingly, researches for solving problems described above in another method other than the conventional method utilizing side wall spacer is in progress.

Figure 6A:
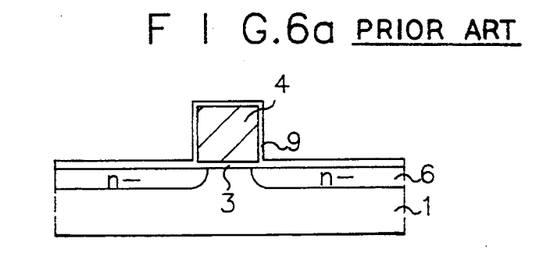

As a representative method, there is a method disclosed in the paper [Shigeo Onishi et al., "Formation of Defect free Junction later by controlling defects due to As+ Implantation," IEEE/IRPS, 1991, pp. 255 to 259], which is to be explained hereinafter, referring to FIG. 6.

Figure 6B:
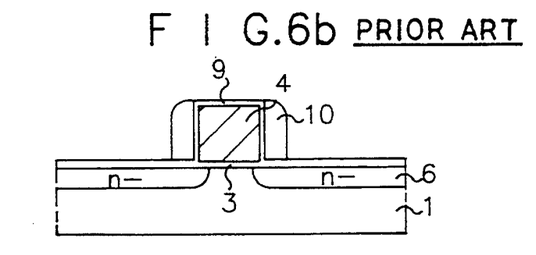
Figure 6C:
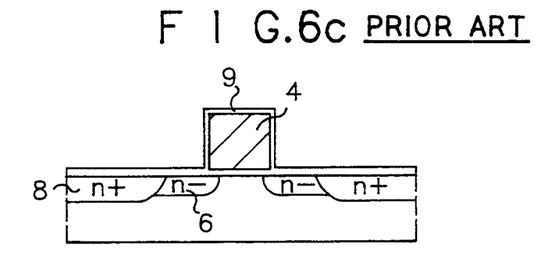

After forming up to a low density impurity area (N−area) by the same process with the fabrication process for transistors of LDD structure described above, as shown in FIG. 6(a), as an etch prevention layer 9 which can protect the silicon substrate on the etch back of the CVD oxide film, a nitride film etc., are formed over a substrate a gate pole 4 having been formed thereon, and as shown in FIG. 6(b), a CVD oxide film is etched back after forming on the etch prevention layer 9 to form gate side wall spacers 10 and high density ion injection is carried out to form high density N+source and drain areas 8 as shown in FIG. 6(c). That is, it is a technology preventing pollution of the substrate due to the plasma radical species of the etchant in the etch back process of the CVD oxide film by an etch prevention layer.

However, even the method described above can not solve the problem of development of dislocations caused by the side wall spacers perfectly.

SUMMARY OF THE INVENTION

The object of this invention for solving above described problems, is to provide a method for fabrication of MOS transistors having a LDD structure suitable for VLSI(Very Large Scaled Integrated Circuit).

This and other objects and the features of this invention can be solved by providing a method for fabrication of semiconductor elements including processes for forming a gate insulation film on a semiconductor substrate of a first conduction type, forming a conduction layer for forming gate pole on the gate insulation film, forming an oxidation prevention layer on the conduction layer, forming a photo-resist pattern having predetermined gate form on the oxidation prevention layer, carrying out selective etchings of the oxidation prevention layer using the photo-resist pattern as a mask and the conduction layer to a certain thicknesses, forming an oxide film by an selective oxidation of the exposed portion of the oxidation prevention layer, carrying out a selective etching of the oxide film by using the oxidation prevention layer as a mask, forming a high density impurity area of a second conduction type in a predetermined area of the semiconductor substrate by a high density ion injection of the second conduction type impurity, removing the oxidation prevention layer and the oxide film, forming a low density impurity area of the second conduction type in a predetermined area of the semiconductor substrate by a low density ion injection of impurity of the second conduction type, and carrying out an annealing under an oxidation process atmosphere.

According to a preferable embodiment of this invention, the conduction layer for forming the gate pole forms polysilicon or amorphous silicon doped with impurity, and the oxidation prevention layer forms a silicon nitride film.

It is preferable for the impurity of the second conduction type ion injected for forming high density source and drain area to use As+ ions in case of NMOS and BF2+ or B+ions in case of PMOS.

And it is preferable for the impurity of the second conduction type ion injected for forming the low density impurity areas to use P+ or As+ions in case of NMOS and BF2+ or B+ ions in case of PMOS.

BRIEF DESCRIPTIONS OF THE DRAWINGS

FIGS. 1(a) to 1(f) show a process of conventional fabrication method for MOS transistors having a LDD structure, FIG. 2 to FIG. 5 explain problems in conventional fabrication method for a LDD structure.

FIGS. 6(a) to 6(c) are a process showing an improved conventional fabrication method for MOS transistor having a LDD structure.

FIGS. 7(a) to 7(f) are a process showing a fabrication method for MOS transistors having a LDD structure in accordance with this invention.

DETAILED DESCRIPTION OF THE INVENTION

This invention is to be explained in detail hereinafter, referring to the attached drawings.

This invention provides a transistor fabrication method suitable for high integration elements over 16M DRAM by forming a LDD structure without using gate side wall spacers.

A fabrication method for MOS transistors of LDD structures in accordance with one embodiment of this invention is to be described hereinafter, referring to FIGS. 7(a) to 7(f).

Figure 7A:
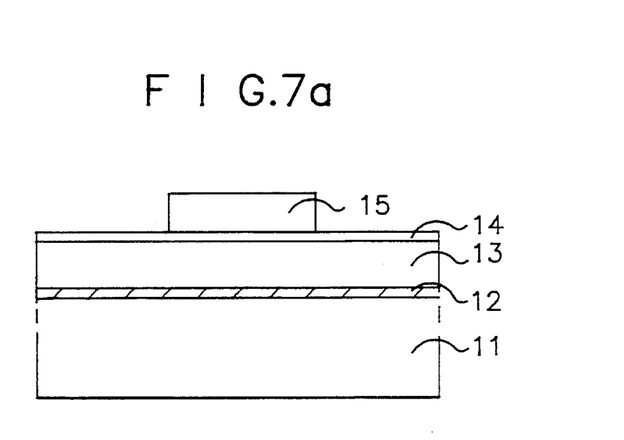

First, as shown in FIG. 7(a), an oxide film is grown to a thickness about 100 Angstroms with a thermal oxidation process using H2/O2 at a temperature about 900 deg. C. as a gate insulation film 12 on a P type semiconductor substrate 11(or on a N well area having an active area for providing many electric elements thereon and rest of the non-active area, and having P well and N well areas required for consisting CMOS integration circuit). Then, as a conduction layer 13 for forming gate pole, impurity doped polysilicon, for example, is deposited to a thickness of about 2000 Angstroms by using LPCVD(Low Pressure Chemical Vapor Deposition) method on the gate oxide film 12. And, as an oxidation prevention layer 14, a nitride film, for example, is formed to a thickness of about 500 Angstroms by using LPCVD method on the polysilicon layer 13, and a predetermined gate pole pattern is formed by selective exposure and development with a photo-lithography process after photo-resist 15 is coated on the nitride film 14.

Figure 7B:
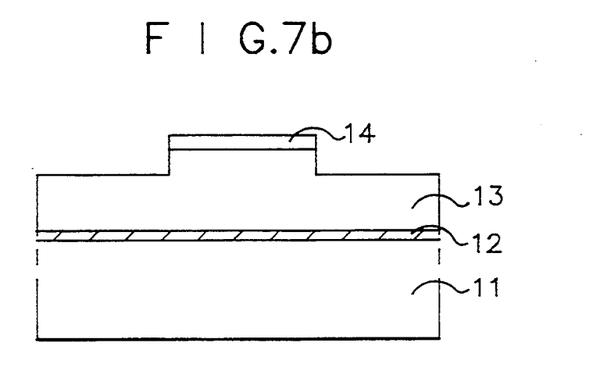

Next, as shown in FIG. 7(b), by using the photo-resist pattern 15 as a mask, the nitride film 14 is reactive ion etched with CHF3/CF4 gas plasma, then, the exposed polysilicon layer 14 is reactive ion etched to a thickness about 300 Angstroms using HBr/Cl2 gas plasma, and the photo-resist pattern is removed by putting into H2SO4/H2O2 solution.

Figure 7C:
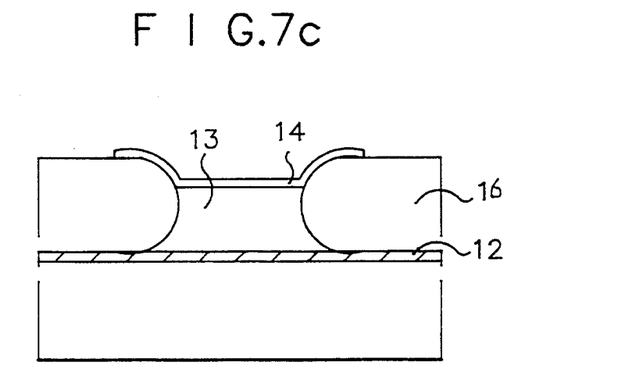

Next, as shown in FIG. 7(c), the exposed portion of the polysilicon layer 13 is oxidized with a thermal oxidation process using H2/O2 at a temperature 900 deg. C. to form a polysilicon oxide film 16. In this time, in order to make the polysilicon oxide film 16 to contact with the gate oxide film 2, the exposed portion of the polysilicon layer is completely oxidized to the lower part thereof. The nitride film 14 serves as a mask in above oxidation process and thus, the polyslicon layer portion of the lower part of the nitride film 14 is prevented from oxidation.

Figure 7D:
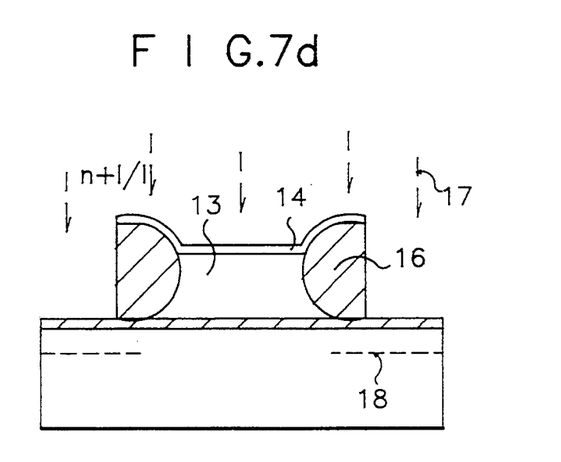

Next, as shown in FIG. 7(d), the polysilicon oxide film 16 is etched until the gate oxide film 2 on above substrate is exposed with a reactive ion etching method using CHF3/CF4 gas plasma by using the nitride film 14 as a mask. In this time, because the polysilicon oxide film 16 is formed encroaching the sides of the lower part of the nitride film 14 to a certain extent in the polysilicon layer 13 oxidation process, when the polysilicon oxide film is etched using the nitride film 14 as a mask as described above, a gate pattern is formed in a form that the polysilicon oxide films 16 are remained on the polysilicon layer 13 under the nitride film and on both sides of the silicon layer 13. Then, in order to form a high density impurity area, as a N type impurity, arsenic(As), for example, is ion injected under a condition of 5.0+10 ions/cm, 40 KeV to form N+ impurity areas 18 in the substrate part of both ends of the gate pattern.

Figure 7E:
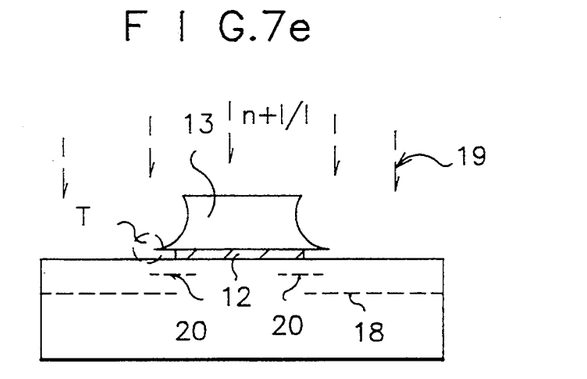

Next, as shown in FIG. 7(e), after removing the nitride film 14 by putting into H3PO4 solution at 180 deg. C., the polysilicon oxide films 16 staying on both sides of the polysilicon layer 13 of the gate pattern are removed by putting into 50:1 HF solution. In this time, the exposed portion of the gate oxide film 2 is also etched, when the etch proceeds up to a certain portion of the lower portion of the tail part T of the polysilicon layer 13 as shown in FIG. 7(e), leaving the tail part T of the polysilicon layer exposed on the substrate not being supported by the gate oxide film but keeping a certain distance with the surface of the substrate. Then, in order to form a low density impurity area, ie., LDD area, as a N type impurity, phosphor(P), for example, is ion injected in a condition of 2.0+10 ions/cm, 30 KeV. In this time, as described above, when the polysilicon oxide film on both sides of the polysilicon layer 13 forming the gate pattern is removed, lower part of both ends of the polysilicon layer 13 is formed like a tail shape T, when an ion injection is carried out to form the low density impurity area, low density impurity areas, ie., N— areas 20 are formed in the lower portion of the tail part T of the polysilicon layer 13 in a self-aligning way.

Figure 7F:
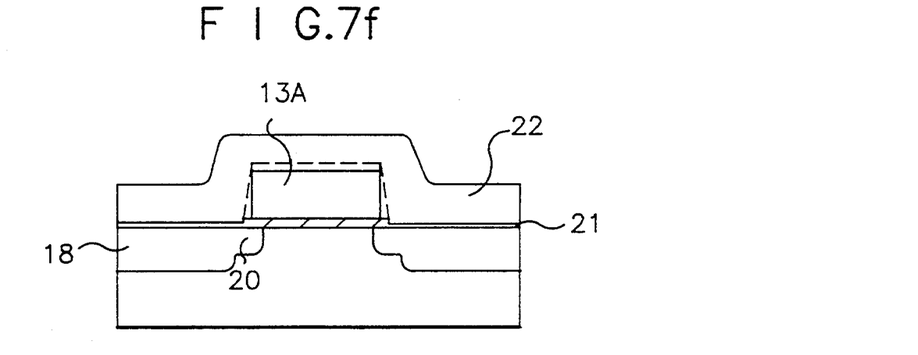

Next, as shown in FIG. 7(f), for forming junctions of the source and the drain areas having high density impurity area 18 and low density impurity area 20, an annealing is carried out under O2/N2 oxidation atmosphere at a temperature about 850 deg. C. for 40 minutes. In this time, as the annealing is carried out under the O2/N2 oxidation atmosphere, the exposed surface of the polysilicon layer 13, particularly the tail portion T is oxidized to form the gate pole 13A having a vertical side profile as well as thin oxide films 21 on the source and drain areas. Then as a protection film 22, a CVD oxide film, for example, is formed over the substrate to a thickness about 2000 Angstroms.

In the meantime, as another embodiment of this invention, it is possible, after proceeding up to FIG. 7(c) process of above embodiment, the oxide film 16 and the oxidation prevention film 14 are removed, to form a source and a drain areas of a LDD structure on the same time by an ion injection of n type impurity.

This is, as described above, because the lower portion of both ends of the polysilicon layer 13 which will become gate pole is formed like a tail shape, when an ion injection is carried out, a n— area having relatively lower impurity density in the substrate area of the lower portion of the tail part T of the polysilicon layer 13, and a n+ area having relatively higher impurity density in the substrate part of both ends of the polysilicon layer 13, is formed respectively.

After forming the n— area and n+ area as described above, an annealing process the same with the process of above embodiment is carried out to form a gate pole having a vertical side profile.

Though case of NMOS has been explained as an example in foregoing embodiments, it is of course possible that PMOS is formed by means of the same method with the foregoing method. In case of PMOS, only differences are that a N type semiconductor substrate is used, and P type impurity is used in the ion injection processes for forming the high density source and drain areas, and the low density impurity area.

As described above, this invention can improve the yield in fabrication and stabilize the characteristics of elements because the above described problems in forming a LDD structure using conventional gate side wall spacers can be solved by forming MOS transistors having a LDD structure not using the gate side wall spacers.

Accordingly, MOS transistors fabricated in accordance with this invention are possible to apply to the cell transistors of the next generation high integration semiconductor memory elements requiring lower junction leakage current per unit area in a high integration semiconductor element having high degree of difficulty.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for fabricating semiconductor elements comprising the the steps of:
    forming a gate insulation film on a semiconductor substrate of a first conduction type;
    forming a conduction layer for forming a gate pole on the gate insulation film;
    forming an oxidation prevention layer on the conduction layer;
    carrying out selective etchings of the oxidation prevention layer and the conduction layer to a certain thicknesses of areas except a gate pole area;
    forming an oxide film by an oxidation of the conduction layer except the area of the oxidation prevention area;
    carrying out a selective etching of the oxide film by using the oxidation prevention layer as a mask;
    forming a high density impurity area of a second conduction type in the semiconductor substrate by a high density ion injection of the second conduction type impurity using the oxidation prevention layer as a mask;
    removing the oxidation prevention layer and the oxide film;
    forming a low density impurity area of the second conduction type in the semiconductor substrate by a low density ion injection of impurity of the second condition type using the conduction layer as a mask; and
    carrying out an annealing under an oxidation process atmosphere.

2. The method as claimed in claim 1, wherein the first conduction type semiconductor substrate is a P type semiconductor substrate or a N type semiconductor substrate.

3. The method as claimed in claim 1, wherein the first conduction type semiconductor substrate comprises a P-well and an N-well.

4. The method as claimed in claim 1, wherein the conduction layer is formed of any selected one of polysilicon or amorphous silicon.

5. The method as claimed in claim 1, wherein the oxidation prevention layer is formed of a silicon nitride film.

6. The method as claimed in claim 1, wherein the conduction layer is oxidized so as to make the oxide film to contact with the gate insulation film.

7. The method as claimed in claim 1, wherein the process for selective etching of the oxide film using the oxidation prevention film as a mask is carried out utilizing reactive ion etching method.

8. The method as claimed in claim 1, wherein As, $BF_2$ or B are used for the ion injected second conduction impurity for forming the high density impurity area.

9. The method as claimed in claim 1, wherein P+ or As, $BF_2$ or B are utilized for the ion injected second conduction impurity for forming the low density impurity area.

10. The method as claimed in claim 1, wherein a dose of the impurity in the ion injection for forming the low density impurity area is lower by 2 order than the dose of the impurity ion injected for forming the high density impurity area.

11. The method as claimed in claim 1, wherein the process for removing the oxidation prevention layer and the oxide film is carried out with wet etching.

12. The method as claimed in claim 1, wherein a forming of junctions of the high and low density impurity areas together with an oxidation of the exposed surface portion of the conduction layer to form a gate pole having a vertical side profile are made by the annealing process under an oxidation process atmosphere.

13. A method for fabricating semiconductor elements comprising the steps of:
    forming a gate insulation film on a semiconductor substrate of a first conduction type;
    forming a conduction layer for forming a gate pole on the gate insulation film;
    forming an oxidation preventing layer on the conduction layer;
    carrying out selective etchings of the oxidation prevention layer and the conduction layer for a certain thicknesses of areas except the gate pole area;
    forming an oxide film by an oxidation of the exposed portion of the conduction layer;
    removing the oxidation prevention layer and the oxide film;
    forming a high density impurity area and a low density impurity area of the second conduction type in the semiconductor substrate by ion injections of impurity of the second conduction type using the etched conduction layer as a mask; and
    carrying out an annealing under an oxidation process atmosphere.

14. The method as claimed in claim 13, wherein the first conduction type semiconductor substrate is a P type semiconductor substrate or a N type semiconductor substrate.

15. The method as claimed in claim 13, wherein the first conduction type semiconductor substrate comprises a P-well and an N-well.

16. The method as claimed in claim 13, wherein the conduction layer is formed of any selected one of polysilicon or amorphous silicon.

17. The method as claimed in claim 13, wherein the oxidation prevention layer is formed of a silicon nitride film.

18. The method as claimed in claim 13, wherein the conduction layer is oxidized so as to make the oxide film to contact with the gate insulation film.

19. The method as claimed in claim 13, wherein As, $BF_2$ or B are used for the ion injected second conduction impurity for forming the impurity area.

20. The method as claimed in claim 13, wherein a forming of junctions of the high and low density impurity areas together with an oxidation of the exposed surface portion of the conduction layer to form a gate pole having a vertical side profile are made by the annealing process under an oxidation process atmosphere.

21. The method as claimed in claim 13, wherein a forming of junctions of the source and the drain together with an oxidation of the exposed surface portion of the conduction layer to form a gate pole having a vertical side profile are made by the annealing process under an oxidation process atmosphere.

* * * * *